(12) United States Patent
Suga et al.

(10) Patent No.: US 6,771,708 B1
(45) Date of Patent: Aug. 3, 2004

(54) NONLINEAR COMPENSATOR

(75) Inventors: Masaru Suga, Narashino (JP); Seiji Isobe, Yokohama (JP); Takeshi Sawada, Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 721 days.

(21) Appl. No.: 09/664,345

(22) Filed: Sep. 18, 2000

(30) Foreign Application Priority Data

Sep. 30, 1999 (JP) .......................................... 11-280343
Dec. 28, 1999 (EP) ........................................... 99125992
Jul. 27, 2000 (JP) ...................................... 2000-227319

(51) Int. Cl.$^7$ ............................................ H04L 27/10
(52) U.S. Cl. ...................... 375/278; 375/297; 455/43; 455/50.1; 455/63; 332/124; 332/160
(58) Field of Search ................................ 375/284, 285, 375/295–297, 146, 278; 455/43, 50.1, 63, 295; 332/107, 123, 124, 159, 160, 176, 177

(56) References Cited

U.S. PATENT DOCUMENTS

| | | | |
|---|---|---|---|
| 4,985,688 A | | 1/1991 | Nagata |
| 5,339,054 A | * | 8/1994 | Taguchi ...................... 332/100 |
| 5,903,611 A | | 5/1999 | Schnabl et al. |
| 5,912,586 A | | 6/1999 | Mitzlaff |
| 5,937,011 A | | 8/1999 | Carney |
| 6,060,953 A | * | 5/2000 | Tsai ............................. 331/11 |
| 6,400,775 B1 | * | 6/2002 | Gourgue et al. ............ 375/296 |
| 6,515,712 B1 | * | 2/2003 | Jeong ......................... 348/608 |

FOREIGN PATENT DOCUMENTS

| | | |
|---|---|---|
| JP | 10-145146 | 5/1998 |
| WO | WO 99/05869 | 2/1999 |
| WO | WO 99/57806 | 11/1999 |
| WO | WO 99/66637 | 12/1999 |

* cited by examiner

*Primary Examiner*—Stephen Chin
*Assistant Examiner*—Dac V. Ha
(74) *Attorney, Agent, or Firm*—Oblon, Spivak, McClelland, Maier & Neustadt, P.C.

(57) ABSTRACT

A nonlinear compensator comprising a signal processing section, a distortion detecting section, and a distortion correcting section. The signal processing section detects the time difference and phase difference between two signals by calculating correlation, synchronizes the two signals with each other, and causes the phase of one signal to coincide with that of the other. The distortion detecting section determines an amplitude error and a phase error in the two signals and inputs the errors as distortion components to a distortion correcting section. The distortion correcting section sequentially selects the amplitude, the phase, and the amount of compensation corresponding to the value of the amplitude from the amounts of compensation registered at the initial stage and updated adaptively, and adds the amount of compensation to the digital base band signal obtained at the input demodulation section to compensate for the distortion components.

7 Claims, 6 Drawing Sheets

NONLINEAR COMPENSATOR

CROSS-REFERENCE TO RELATED APPLICATIONS

This application is based upon and claims the benefit of priority from the prior Japanese Patent Applications No. 11-280343, filed Sep. 30, 1999, No. 2000-227319, filed Jul. 27, 2000; and European Patent Application No. 99125992.0, filed Dec. 28, 1999, the entire contents of which are incorporated herein by reference.

BACKGROUND OF THE INVENTION

This invention relates to a nonlinear compensator which compensates for the nonlinear characteristic of the amplifier in, for example, a transmitter and is used in a transmitting system, such as a medium-wave, short-wave, ground-wave, or satellite transmitting system, or a cable television.

Presently, in analog television broadcasting, a predistorter having the opposite of the nonlinear characteristic of an amplifier makes nonlinear compensation. Since the nonlinear characteristic of the amplifier particularly varies with the operating temperature of the amplifier or the like, the compensation characteristic is changed, depending on the operating conditions of the amplifier.

In analog television broadcasting, the signal peak value is determined by a synchronous peak value and therefore is almost constant. Synchronization is maintained in the vicinity of the clip value. Therefore, phase distortion occurring in the vicinity of the clip level need not be taken into account and only synchronous amplitude has to be corrected so that the synchronization length may be the same. In addition, since the peak factor (peak value/average value) is relatively small, the linearity in the low-level signal region is not required much.

On the other hand, in a next generation of digital television broadcasting, use of an OFDM (orthogonal frequency division multiplex) system has been decided and various efforts have been made to put the OFDM system to practical use. In the OFDM system, because of the character of the OFDM signal, the peak factor is much greater than that in the analog television broadcasting. As a result, the linearity ranging from a low level to a high level is required in the OFDM system. Additionally, since the phase of each carrier plays a key role in information transmission, even a slight distortion in the phase rotation leads to degradation of the characteristic. Therefore, the nonlinear characteristic and phase rotation are required to be compensated for accurately.

BRIEF SUMMARY OF THE INVENTION

As described above, in the digital signal transmission by the OFDM system, the nonlinear characteristic is required to be compensated for accurately. Since there have not been such needs in the conventional analog system, the development of a device that meets the requirements has been wanted.

It is, accordingly, an object of the present invention to provide a nonlinear compensator which is easy to adjust and capable of making adaptive compensation for the nonlinear characteristic and phase rotation that vary with season, weather, and time.

To achieve the foregoing object, a nonlinear compensator according to the present invention has the following characteristic configurations:

(1) A nonlinear compensator for compensating for the nonlinear characteristic of a compensated electronic device that deals with a transfer signal, the nonlinear compensator characterized by comprising: a signal processing section which takes in the input signal and output signal of the compensated electronic device, demodulates the signals suitably in such a manner that they have the same signal form, detects the time difference and phase difference between the two signals by correlating the two signals with each other, and not only synchronizes the two signals with each other but also causes the phase of one signal to coincide with that of the other on the basis of the detected time difference and phase difference; a distortion detecting section for detecting, as distortion components, an amplitude error and phase error in the input signal and output signal of the compensated electronic device that have been synchronized with each other and made in phase with one another by the signal processing section; and a distortion correcting section for producing the amount of nonlinear distortion compensation for the compensated electronic device on the basis of the distortion components detected by the distortion detecting section and compensating for the input signal to the compensated electronic device on the basis of the amount of distortion compensation.

(2) The configuration in item (1) is characterized in that the signal processing section detects the time difference between the two signals and synchronizes the two signals on the basis of the detected time difference in such a manner that the difference between the input signal and output signal of the compensated electronic device adjusted to the same signal form is minimized.

(3) The configuration in item (1) is characterized in that the signal processing section includes an input demodulation section for generating an input-side base band signal by demodulating the transfer signal to the compensated electronic device and an output demodulation section for generating an output-side base band signal by demodulating the transfer signal outputted from the compensated electronic device, detects the time difference and phase difference between the input-side and output-side base band signals obtained at the input demodulation section and output demodulation section, and not only synchronizes the two signals with each other but also causes the phase of one signal to coincide with that of the other on the basis of the detected time difference and phase difference, and further includes an output converting section for converting the output of the distortion correcting section into the format of the original transfer signal.

(4) The configuration in item (1) is characterized in that the signal processing section delays the input signal to the compensated electronic device according to the amount of delay equivalent to the detected time difference.

(5) The configuration in item (1) is characterized in that the signal processing section gives the amount of phase shift equivalent to the detected phase difference to the input signal or output signal of the compensated electronic device.

(6) The configuration in item (1) is characterized in that the distortion correcting section includes an amount-of-compensation table for holding the amount of distortion compensation, registers the amount of distortion compensation at the time of initial setting, reads the amount of distortion compensation corresponding to the amplitude of the input signal to the compensated electronic device from the amount-of-compensation table during service, and compensates for the input signal.

(7) The configuration in item (6) is characterized in that the amount-of-compensation table in the distortion correcting section includes a present-use table and a standby table, stores the amount of distortion compensation obtained at the distortion detecting section and, after the storage has been completed, replaces the present-use table with the standby table.

(8) The configuration in item (1) is characterized by further comprising monitor means for monitoring the compensated electronic device by monitoring the distortion components obtained at the distortion detecting section.

(9) The configuration in item (1) is characterized in that the signal processing section includes carrier synchronizing means for synchronizing the carrier frequency and carrier phase of the input signal to the compensated electronic device with those of the output signal of the compensated electronic device on the basis of the detected phase difference.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Hereinafter, referring to the accompanying drawings, embodiments of the present invention will be explained.

Figure 1:
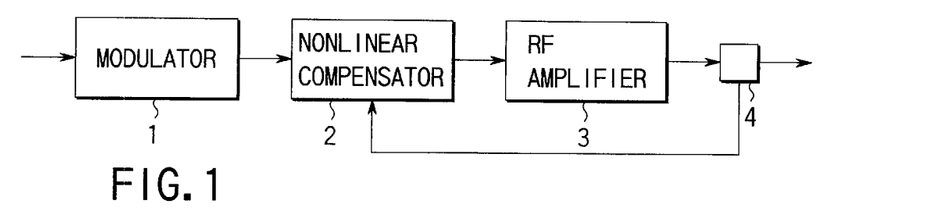
FIG. 1 is a block diagram of an OFDM transmitting device to which the present invention is applied.

FIG. 1 shows the configuration of an OFDM transmitting device to which the present invention is applied. In the OFDM transmitting device, a modulator 1 outputs an RF OFDM signal. The OFDM signal passes through a nonlinear compensator 2 related to the present invention and is supplied to an RF amplifier 3. The RF amplifier 3 amplifies the power of the supplied signal and outputs the resulting signal as a transmitting signal. Part of the output of the RF amplifier 3 is distributed by a distributor (a directional coupler) 4 and supplied to the nonlinear compensator 2.

Figure 2:
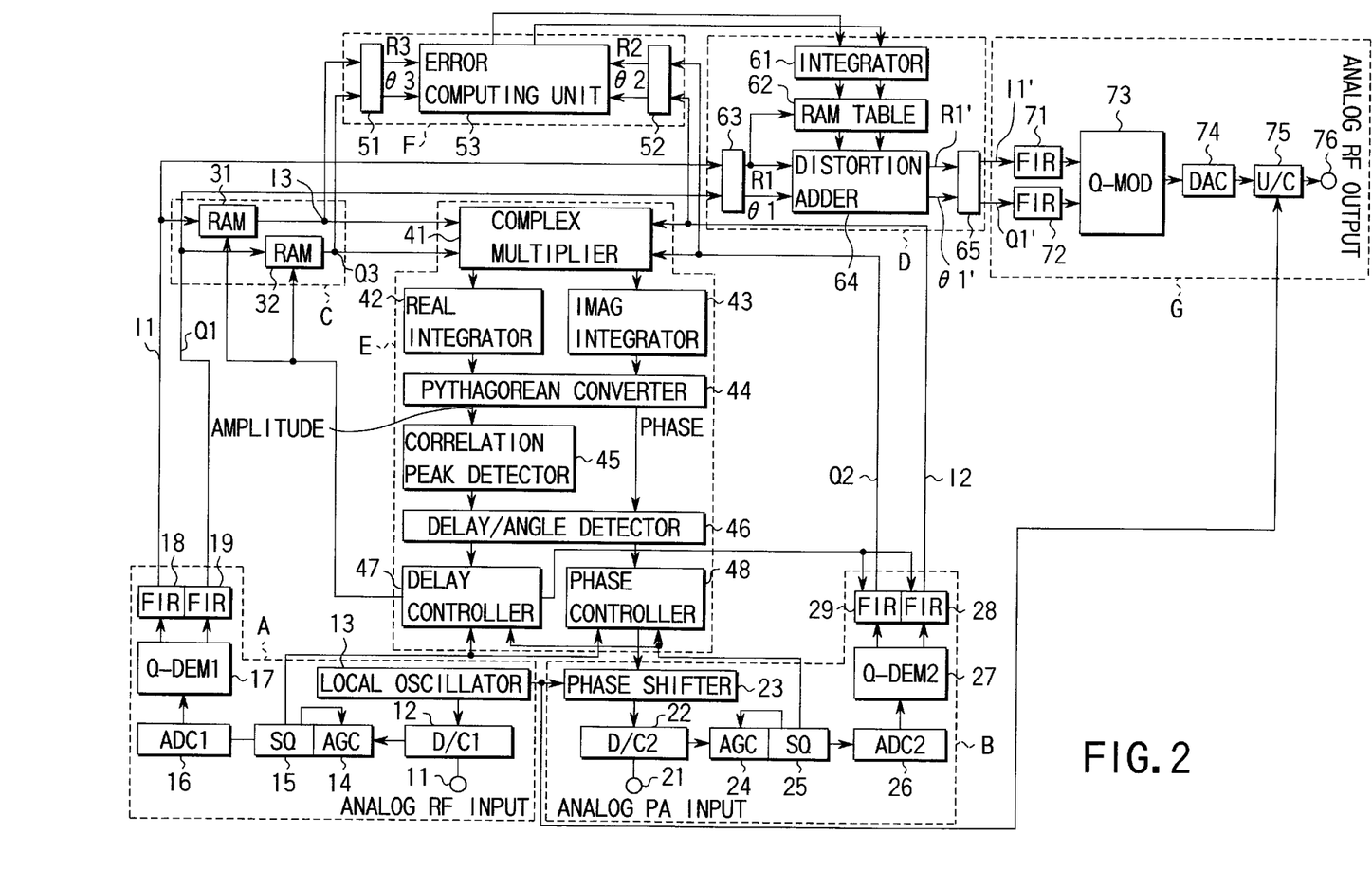
FIG. 2 is a block diagram of a nonlinear compensator for compensating for the nonlinear characteristic of the RF amplifier of FIG. 1 according to an embodiment of the present invention.

FIG. 2 shows the configuration of the nonlinear compensator 2. In FIG. 2, the RF signal from the modulator 1 is supplied to an analog RF input terminal 11. The RF signal supplied to the terminal 11 is converted by a first down converter (D/C1) 12 into an IF signal on the basis of the local signal from a local oscillator 13. An AGC (automatic gain control) circuit 14 stabilizes the IF signal to a specific amplitude level. A squelch (SQ) circuit 15 judges whether or not the output of the AGC circuit 14 is present. The output of the AGC circuit 14 is converted by a first analog/digital converter (ADC1) 16 into a digital IF signal. Thereafter, the digital IF signal is demodulated orthogonally by a first orthogonal demodulation (Q-DEM) circuit 17, thereby producing digital base band signals I1, Q1 in complex form. The I1 and Q1 signals obtained are down-sampled by FIR filters (or LPF) 18, 19, if necessary. Those circuits constitute an input demodulation section A.

On the other hand, the RF signal outputted from the RF amplifier 3 is supplied to an analog PA input terminal 21. The RF signal supplied to the terminal 21 is converted by a second down converter (D/C2) into an IF signal on the basis of the local signal phase-adjusted by a phase shifter 23. The IF signal is stabilized by an AGC circuit 24 to a specific amplitude level. A squelch (SQ) circuit 25 judges whether or not the output of the AGC circuit 24 is present. The output of the AGC circuit 24 is converted by a second analog/digital converter (ADC2) 26 into a digital IF signal. Thereafter, the digital IF signal is demodulated orthogonally by a second orthogonal demodulation (Q-DEM) circuit 27, thereby producing digital base band signals I2, Q2 in complex form. The I2 and Q2 signals obtained are down-sampled by FIR filters (or LPF) 28, 29, if necessary. Those circuits constitute an output demodulation section B.

The digital base band signals I1, Q1 outputted from the input demodulation section A are inputted to a delay adjusting section C and a distortion correcting section D. The delay adjusting section C includes RAM delay units 31, 32 for delaying the digital base band signals I1, Q1 outputted from the input demodulation section A for a specific time. The digital base band signals I3, Q3 delayed by the RAM delay units 31, 32, together with the digital base band signals I2, Q2 outputted from the output demodulation section B, are supplied to a delay detecting section E and a distortion detecting section F.

In the delay detecting section E, the base band signals I3, Q3 from the delay adjusting section C and the base band signals I2, Q2 from the output demodulation section B are supplied to a complex multiplier 41. The complex multiplier 41 multiplies both input signals in complex form and finds a complex correlation between them, thereby producing a REAL (real part) signal and an IMAG (imaginary part) signal. The REAL signal and IMAG signal obtained are supplied to a REAL integrator 42 and an IMAG integrator 43.

These integrators 42, 43 remove the effects of noise or the like by integrating an interval to find, for example, a cumulative value/cumulative time. The outputs of the integrators 42, 43 are supplied to a Pythagorean converter 44, which converts the Cartesian coordinates into polar coordinates. Of the outputs of the Pythagorean converter 44, the amplitude value is supplied to a correlation peak detector 45. The correlation peak detector 45 determines the peak position in the correlative output of two input signals. The peak position information detected at the correlation peak detector 45, together with the angle value (phase value) outputted from the Pythagorean converter 44, is supplied to a delay/angle detector 46.

From the peak position information, the delay/angle detector 46 determines the time difference and phase difference (angle) between the digital base band signals I3, Q3 on the amplifier input side and the digital base band signals I2, Q2 on the amplifier output side. The time difference obtained is supplied to a delay controller 47 and the phase difference is supplied to a phase controller 48. According to the time difference, the delay controller 47 sets not only the amount of delay in the RAM delay units 31, 32 of the delay adjusting section C to perform rough synchronization, but also the value of coefficient in the FIR filters 28, 29 in the output demodulation section B to perform precise synchronization. This enables the digital base band signals I3, Q3 on the amplifier input side to be synchronized with the digital base band signals I2, Q2 on the amplifier output side. In addition, the phase controller 48 adjusts the amount of phase shift in the phase shifter 23 of the output demodulation section B according to the supplied phase difference. This causes the phase on the amplifier input side to coincide with the phase on the amplifier output side.

When the digital base band signals include no signal component, the delay controller 47 and phase controller 48 can obtain neither the time difference nor the phase difference and therefore might be uncontrollable and operate erroneously. To avoid this, the presence or absence of signal components is judged from the outputs from the squelch circuits 15, 25 provided in the input modulation section A and output demodulation section B. Only when there is any signal component, control is performed.

In the distortion detecting section F, Pythagorean converters 51, 52 convert the Cartesian coordinates (I3, Q3), (I2, Q2) of the digital base band signals I3, Q3 from the delay adjusting section C and the digital base band signals I2, Q2 from the output demodulation section B into the polar coordinates (R3, θ3), (R2, θ2) of them. Thereafter, an error computing unit 53 determines the amplitude error ΔR and phase error Δθ in them.

$\Delta R = R3 - R2$ $\Delta \theta = \theta 3 - \theta 2$

The amplitude error ΔR and phase error Δθ obtained are supplied to a distortion correcting section D.

In the distortion correcting section D, an integrator 61 integrates the amplitude error ΔR and phase error Δθ from the distortion detecting section F over an interval. The integration result is registered as the amount of distortion compensation in a RAM table 62. On the other hand, after a Pythagorean converter 63 converts the Cartesian coordinates (I1, Q1) of the digital base band signals I1, Q1 from the input modulation section A into the polar coordinates (R1, θ1). Thereafter, the amount of distortion compensation (ΔR, Δθ) corresponding to the value of R1 is read from the RAM table 62. An amount-of-distortion compensation adding section 64 adds the amount of distortion compensation to the obtained polar coordinates. The resulting values are converted by a reverse Pythagorean converter 65 into the original Cartesian coordinates (I1', Q1'). The digital base band signals outputted from the distortion correcting section D are supplied to an output converting section G.

In the output converting section G, the input digital base band signals are returned by FIR filters (or LPF) 71, 72 to the original bit rate (by over-sampling). The resulting signals are modulated orthogonally by an orthogonal modulation (Q-MOD) circuit 73 into an IF signal, which is then converted by a digital/analog converter (DAC) 74 into an analog signal. Thereafter, an UP converter (U/C) 75 converts the analog signal into an RF signal on the basis of the local signal from the local oscillator 13. The RF signal is outputted as a distortion-compensated signal at an RF output terminal 76.

Next, a concrete configuration of the distortion correcting section D will be explained.

Figure 3:
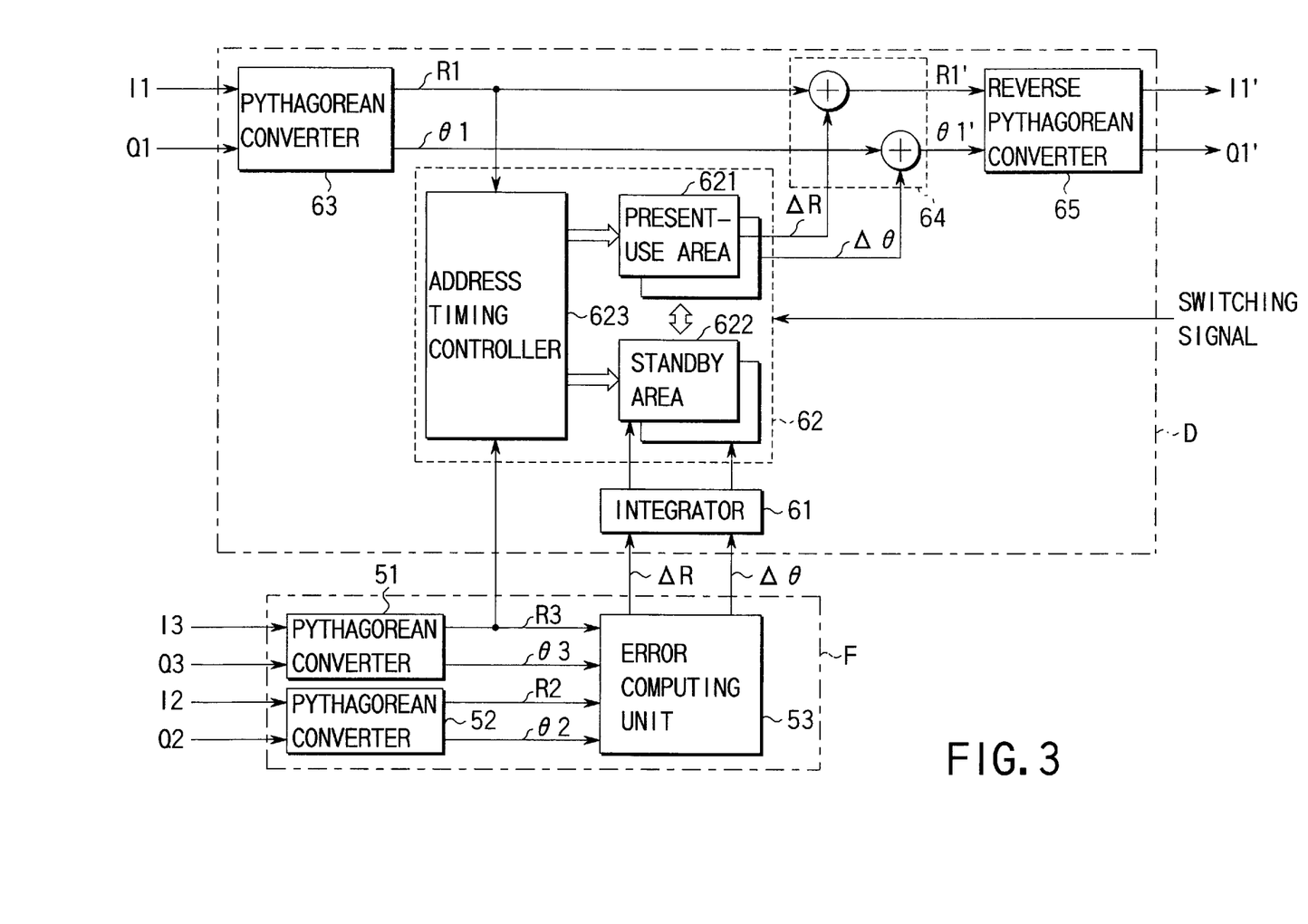
FIG. 3 is a block diagram showing a concrete configuration of the distortion compensating section in the embodiment of FIG. 2.

FIG. 3 shows the configuration of the distortion correcting section D and the relationship with the distortion detecting section F. A RAM table 62 in the distortion correcting section D includes a present-use area 621 and a standby area 622 in a dual port memory, which are designed to operate independently. Each of the present-use area and standby area 622 has an amplitude value (R) section and a angle (θ) section. When a switching signal is externally given, the data written in the standby area 622 is moved to the present-use area 621.

The standby area 622 is written into and the present-use area is read from according to the address from an address timing control section 623. Specifically, the address timing control section 623 takes in the polar-coordinate-converted amplitude value data R3 of the input-side base band signal from the distortion detecting section F at the time of initial setting and generates a write address for the standby area 622. Then, the address timing control section 623 writes the amounts of distortion compensation (ΔR, Δθ) from the integrator 61 into the standby area 622 by amplitude value (ΔR) and by angle (Δθ) in such a manner that they correspond to R3, thereby creating updated data on the amounts of distortion compensation. In addition, the address timing control section 623 takes in the R1 data from the Pythagorean converter 63 of the distortion correcting section D in service and generates a read address for the present-use area 621. Then, it reads the corresponding amounts of distortion compensation by amplitude value (ΔR) and by angle (Δθ) and sends them to the amount-of-distortion-compensation adding section 64.

The timing of switching between the present-use area 621 and standby area 622 is such that the amounts of distortion compensation accumulated in the integrator 61 during a specific period ranging from when power is turned on to when resetting is done are written into the standby area 622, and thereafter the data in the standby area 622 is moved to the present-use area 621.

As described above, in the nonlinear compensator 2 of the present embodiment, the input modulation section A and output demodulation section B extract the digital base band signals in the RF input and RF output of the RF amplifier 3. The delay detecting section E detects the time difference and phase difference between the two signals by calculating correlation. The delay adjusting section C synchronizes the two signals with each other. Moreover, the phase shifter 23 causes the phase of one signal to coincide with that of the other. In this state, the distortion detecting section F determines the amplitude error and phase error in the two signals and inputs the errors as distortion components to the distortion correcting section D. The distortion correcting section D sequentially selects the amounts of compensation corresponding to the amplitude values from the amounts of compensation registered in the aforementioned means and adds the amount of compensation to the digital base band signals obtained at the input modulation section A to compensate for the distortion component. Then, the output converting section G converts the resulting signal into a signal in the original format and outputs the converted signal to the RF amplifier 3. This enables the RF signal having the opposite of the nonlinear characteristic of the RF amplifier 3 to be inputted to the RF amplifier 3, thereby compensating for the distortion components caused by the nonlinear characteristic of the RF output.

The amount of compensation is updated at the time of turning on the power or resetting and further suitably even during a normal operation in such a manner that it follows fluctuations in the nonlinear characteristic of the RF amplifier. This facilitates the adjustment of the amount of compensation, making it possible to make adaptive compensation for the nonlinear characteristic and phase rotation which vary with season, weather, or time.

Moreover, the output value of the distortion detecting section F is monitored. When the output value has exceeded a reference value, it is judged that an abnormality has occurred and an alarm is given, thereby informing the manager of the malfunction of the RF amplifier 3 or the like as soon as possible.

The present invention is not limited to the above embodiment.

For instance, while in the above embodiment, the coefficient values in the FIR filters 28, 29 in the output demodulation section B are controlled to perform precise synchronization, the coefficient values in the FIR filters 18, 19 in the input demodulation section A may be controlled to perform precise synchronization.

Furthermore, while in the above embodiment, the phases are caused to coincide with each other by adjusting the amount of phase shift in the phase shifter 23 of the output demodulation section B, the phases may be caused to coincide with each other by causing the phase shifter to adjust the phase of the local signal supplied to the down converter 12 of the input demodulation section A.

Additionally, in the above embodiment, the modulator 1 has inputted an analog RF signal. When the modulator 1 outputs a digital base band signal directly, the digital base band signal may be supplied directly to the delay adjusting section C and distortion correcting section D in place of the output of the input demodulation section A, which produces the same effect as that of the above embodiment.

Still furthermore, in the above embodiment, the present invention has been applied to the OFDM transmitting device, the invention is not limited to this. For instance, the invention may be applied to compensating for the nonlinear characteristic and phase rotation in the electronic circuitry of another analog communication system or digital communication system, such as a transmitting device for NTSC analog television signals or an transmitting device for ATSC digital television signals.

Figure 4:
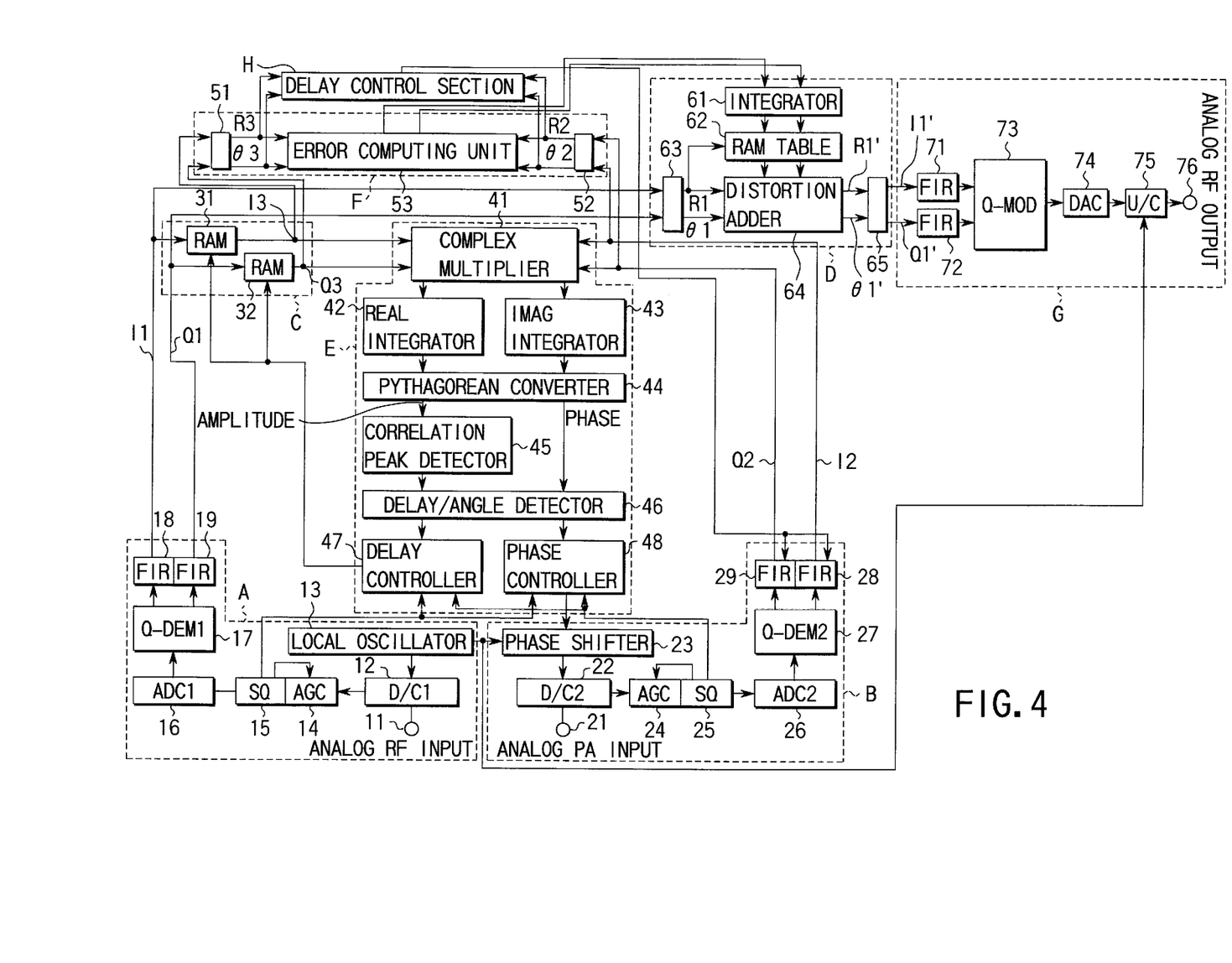
FIG. 4 is a block diagram of a nonlinear compensator according to another embodiment of the present invention.

While in the above embodiment, the delay controller 47 of the delay detecting section E controls the coefficient values in the FIR filters 28, 29 of the output demodulation section B to perform precise synchronization, the present invention is not restricted to this. For instance, as shown in FIG. 4, the signals (R3, θ3), (R2, θ2) from the Pythagorean converters 51, 52 to the error computing unit 53 in the distortion detecting section F may be inputted to a delay control section H. The delay control section H then may determine the phase difference between the two signals and control the coefficient values of the FIR filters 28, 29 in such a manner that the error component becomes the smallest, which realizes similar precise synchronization. In FIG. 4, the same parts as those in FIG. 2 are indicated by the same reference numerals and explanation of them will be omitted.

The process of performing precise synchronization using the inputs (R3, θ3), (R2, θ2) to the error computing unit 53 will be explained below.

Figure 5A:
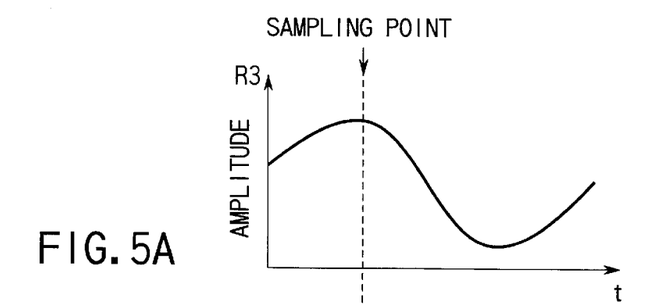
FIGS. 5A and 5B are waveform diagrams to help explain an accurate synchronizing process in the embodiment of FIG. 4.
Figure 5B:
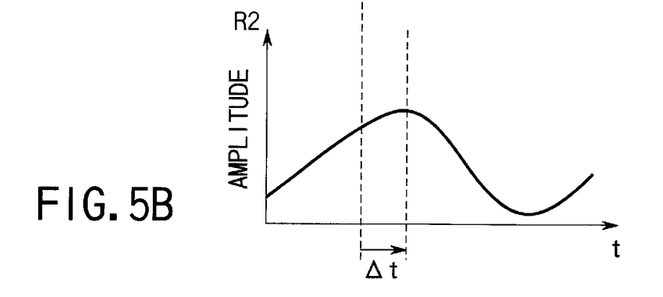
Figure 6A:
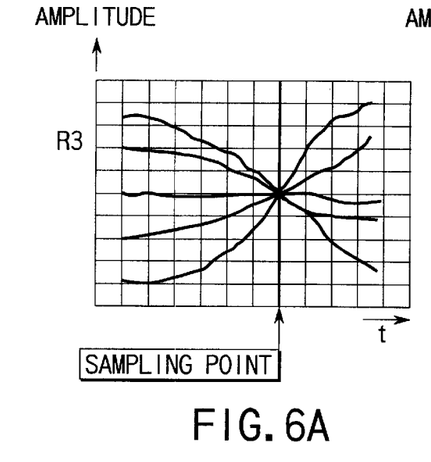
FIGS. 6A and 6B are characteristic diagrams to help explain the accurate synchronizing process in the embodiment of FIG. 4.
Figure 6B:
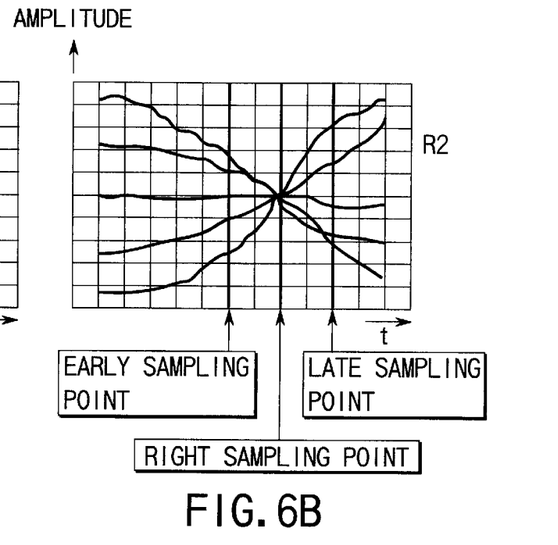

FIGS. 5A and 5B show a comparison between the change of amplitude R3 and that of amplitude R2 among the inputs to the delay control section H. As seen from the figure, when the sampling point of R3 does not coincide with the sampling point of R2, another point in the waveform of R2 is sampled, leading to great variations in the distortion components obtained from the instantaneous values R2 and R3. FIGS. 6A and 6B show the relationship between the sampling point and variations. As is apparent from the figures, variations can be minimized when the sampling point of R2 coincides with that of R3. This holds true for angles of θ2 and θ3. Thus, the delay control section H detects the time difference between the sampling point of (R3, θ3) and that of (R2, θ2) and controls the FIR filters 28, 29 so as to minimize the time difference, thereby realizing precise synchronization.

While in the above embodiment, distortion has been corrected by adding polar coordinates (R, θ), the same thing can be done by multiplying Cartesian coordinates (I, Q).

Furthermore, while in the above embodiment, the full loop configuration enables automatic adjustment and automatic control to make adaptive compensation for the nonlinear characteristic and phase rotation, the detect result of each detecting section may be displayed suitably and the user may adjust or correct the characteristic or rotation manually, while watching what has been displayed.

As described above, with the present invention, it is possible to provide a nonlinear compensator which is easy to adjust and capable of making adaptive compensation for the nonlinear characteristic and phase rotation that vary with season, weather, and time.

In the embodiments shown in FIGS. 2 and 4, the first down converter (D/C1) 12, second down converter (D/C2) 22, and up converter (U/C) 75 perform frequency conversion using the common local oscillator 13, thereby achieving the frequency synchronization. Thus, to accomplish the carrier synchronization of the RF input and output, the phase shifter 23 is used, further achieving phase synchronization.

In some transmission systems, however, the local oscillator cannot be shared by the up converter and down converters. In this case, to achieve the carrier synchronization of the RF input and output, frequency synchronization and phase synchronization are needed.

Figure 7:
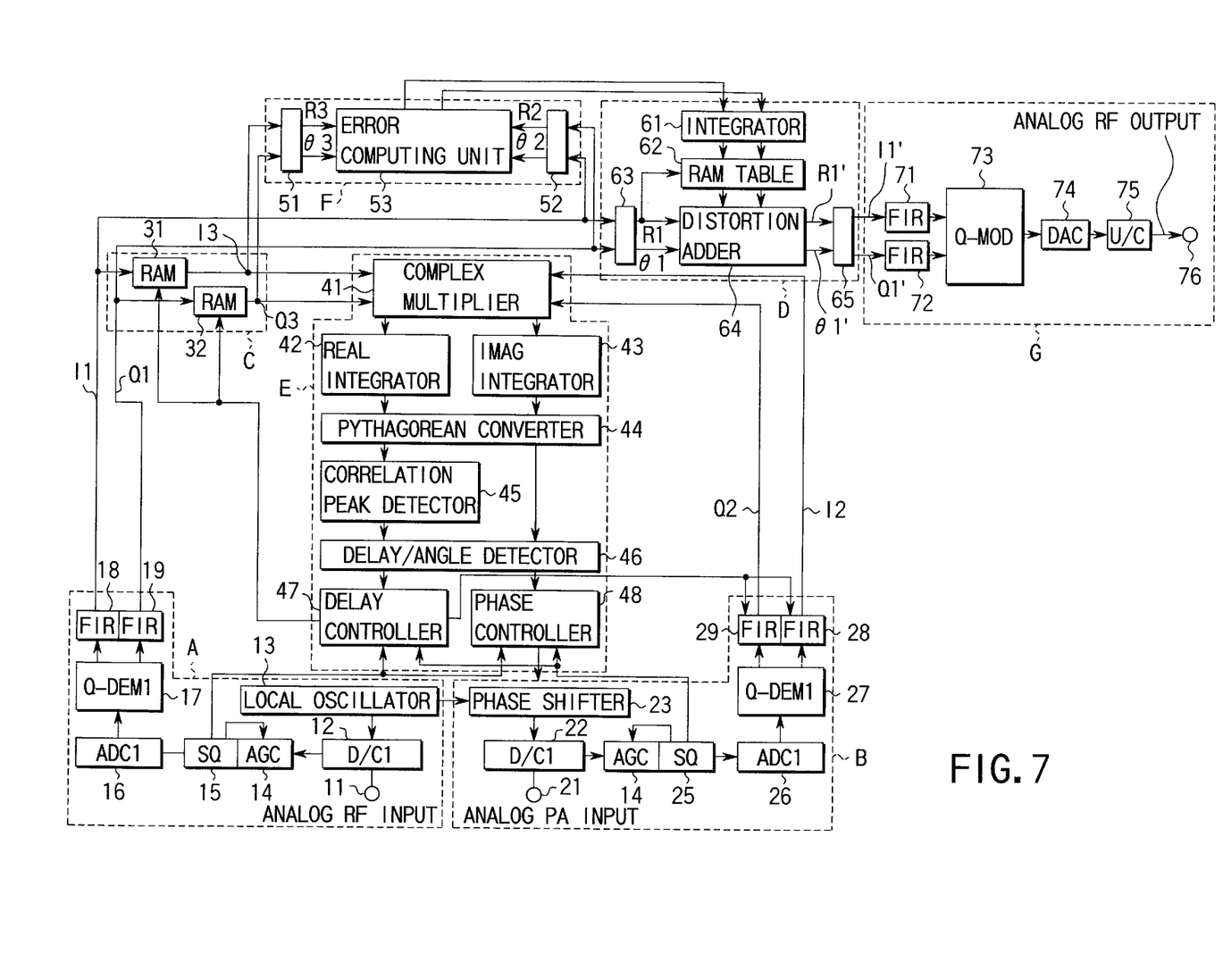
FIG. 7 is a block diagram showing the configuration of another embodiment of a nonlinear compensator according to the present invention.

FIG. 7 is a block diagram showing the configuration of an embodiment of a nonlinear compensator that realizes carrier synchronization even when the local oscillator cannot be shared. In FIG. 7, the same parts as those in FIG. 2 are indicated by the same reference numerals and a repeated explanation will be omitted.

As seen from comparison with the configuration of FIG. 2, the nonlinear compensator of FIG. 7 is such that the output demodulation section B uses a voltage-control local oscillator 30 in place of the phase shifter, the delay detecting section E uses a carrier synchronizing circuit 49 in place of the phase controller 48, and a local oscillator 77 for the up converter 75 is added to the output converting section G.

Figure 8:
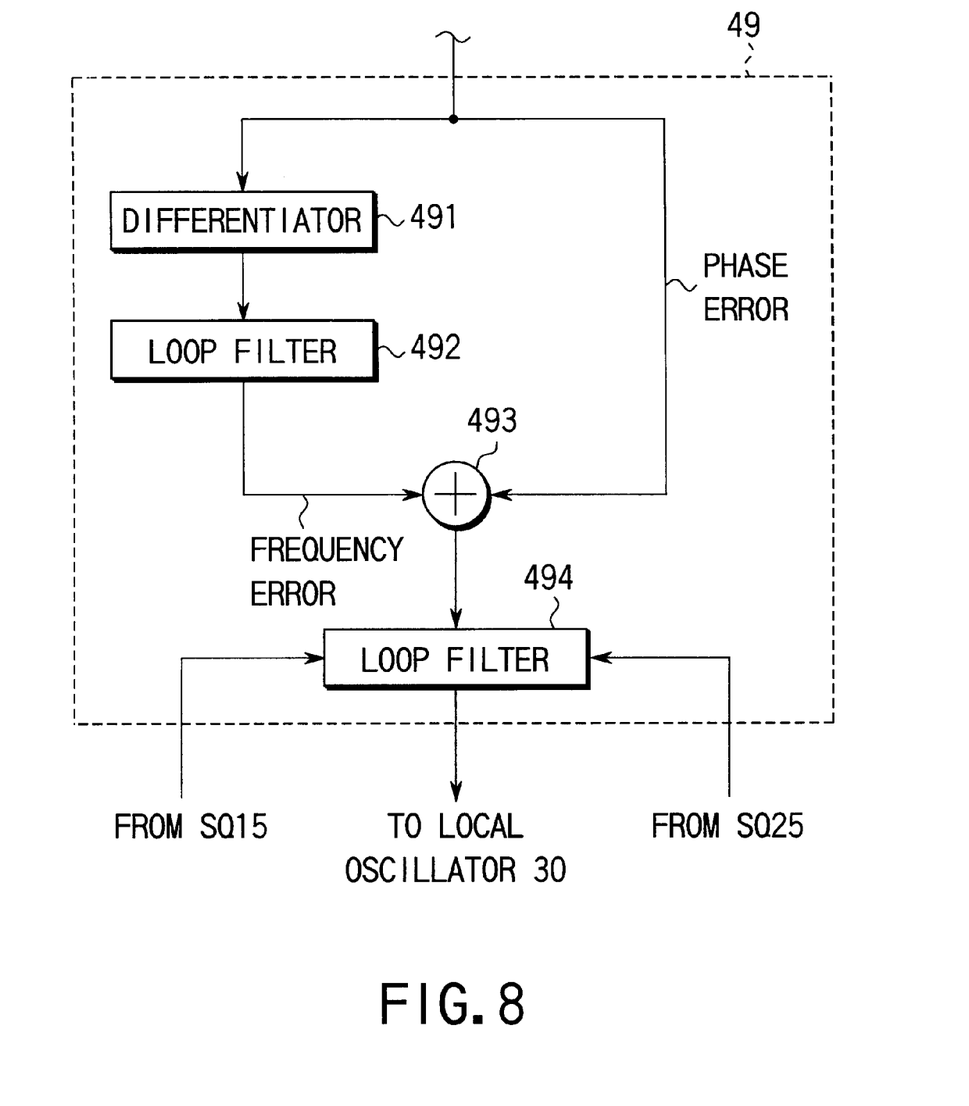
FIG. 8 is a block diagram showing a concrete configuration of the carrier synchronizing circuit in the embodiment of FIG. 7.

The carrier synchronizing circuit 49 is constructed as shown in FIG. 8. Specifically, in the carrier synchronizing circuit 49, the phase difference output of the delay/angle detector 46 is differentiated by a differentiator 491 and then integrated by a loop filter 492. Thereafter, the result is added to the inputted phase difference signal at an adder 493. The resulting signal is integrated by a loop filter 494 and then outputted as a frequency control voltage to the local oscillator 30.

It is assumed that, from the outputs of the squelch circuits 15, 25 in the input demodulation section A and output demodulation section B, the loop filter 494 judges whether or not any signal component is present and performs control only when a signal component is present.

With the above configuration, the processing operation will be explained.

It is assumed that the delay time in the amplifier input modulation signal has coincided with that in the amplifier output modulation signal as a result of delay control by the delay controller 47. When the delay times have coincided with each other, the phase difference between the two modulation signals appears in the phase output of the Pythagorean converter 44.

Since in the nonlinear compensator of the present embodiment, the local oscillator 13 in the input modulation section A and the local oscillator 77 in the output converting section G are independent of each other, the carrier in the amplifier input and that in the amplifier output are not synchronized with each other. To overcome this problem, the present embodiment uses the voltage-control local oscillator 30 in the output modulation section B and controls the oscillation frequency of the local oscillator 30 according to the output of the carrier synchronizing circuit 49 in the delay detecting section E, thereby achieving frequency synchronization and phase synchronization.

Specifically, the delay detecting section E inputs the phase difference output $\theta_c$ of the delay/angle detector 46 to the carrier synchronizing circuit 49. In the carrier synchronizing circuit 49, when the carrier frequency of one modulation input signal and that of the other modulation input signal are not synchronized with one another, the differentiator 491 differentiates the phase difference output $\theta_c$ of the delay/angle detector 46 to obtain the signal expressed as $\Delta\theta_c=\theta_{cN-1}-\theta_{cN}$ and then the loop filter 492 integrates the resulting signal to obtain a frequency error signal. The frequency error signal is inputted via the adder 493 to the loop filter 494, which integrates the error signal. The result of the integration is the frequency control voltage equivalent to the frequency error. The frequency control voltage is supplied to the local oscillator 30 in the output modulation section B, which controls its oscillation frequency, thereby eliminating the frequency error. The AFC (automatic frequency control) system synchronizes the carrier frequency in the amplifier input modulation signal with that in the amplifier output modulation signal.

On the other hand, when the frequency in the one modulation input signal and that in the other modulation input signal are synchronized with one another, the phase difference output $\theta_c$ of the delay/angle detector 46 represents the phase difference of the carrier. In the carrier synchronizing circuit 49, the phase difference output of the delay/angle detector 46 is inputted via the adder 493 to the loop filter 494, which integrates the phase difference output. The result of the integration is the frequency control voltage equivalent to the phase difference. The frequency control voltage is supplied to the local oscillator 30 in the output modulation section B, which controls its oscillation frequency, thereby eliminating the phase difference. The PLL system synchronizes the carrier in the amplifier input modulation signal with that in the amplifier output modulation signal.

The carrier synchronizing circuit 49 constructed as described above realizes both AFC and PLL at the same time. By controlling the oscillation frequency of the local oscillator 30 at the carrier synchronizing circuit 49, the synchronization of the carrier frequencies and that of the carrier phases are realized at the same time.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A nonlinear compensator for compensating for the nonlinear characteristic of a compensated electronic device that deals with a transfer signal, said nonlinear compensator comprising:

a signal processing section which takes in an input signal and an output signal of said compensated electronic device, demodulates the signals suitably in such a manner that they have the same signal form, detects the time difference and phase difference between the two signals by correlating the two signals with each other, and not only synchronizes the two signals with each other but also causes the phase of one signal to coincide with that of the other on the basis of the detected time difference and phase difference;

a distortion detecting section for detecting, as distortion components, an amplitude error and phase error in the input signal and output signal of said compensated electronic device that have been synchronized with each other and made in phase with one another by the signal processing section; and a distortion correcting section for producing the amount of nonlinear distortion compensation for said compensated electronic device on the basis of the distortion components detected by the distortion detecting section and compensating for the input signal to said compensated electronic device on the basis of the amount of distortion compensation;

wherein said signal processing section includes an input demodulation section for generating an input-side base band signal by demodulating the transfer signal to said compensated electronic device and an output demodulation section for generating an output-side base band signal by demodulating the transfer signal outputted from said compensated electronic device, detects the time difference and phase difference between the input-side and output-side base band signals obtained at said input demodulation section and output demodulation section, and not only synchronizes the two signals with each other but also causes the phase of one signal to coincide with that of the other on the basis of the detected time difference and phase difference, and further includes an output converting section for converting the output of said distortion correcting section into the format of the original transfer signal.

2. A nonlinear compensator for compensating for the nonlinear characteristic of a compensated electronic device that deals with a transfer signal, said nonlinear compensator comprising:

a signal processing section which takes in an input signal and an output signal of said compensated electronic device, demodulates the signals suitably in such a manner that they have the same signal form, detects the time difference and phase difference between the two signals by correlating the two signals with each other, and not only synchronizes the two signals with each other but also causes the phase of one signal to coincide with that of the other on the basis of the detected time difference and phase difference;

a distortion detecting section for detecting, as distortion components, an amplitude error and phase error in the input signal and output signal of said compensated electronic device that have been synchronized with each other and made in phase with one another by the signal processing section; and a distortion correcting section for producing the amount of nonlinear distortion compensation for said compensated electronic device on the basis of the distortion components detected by the distortion detecting section and compensating for the input signal to said compensated electronic device on the basis of the amount of distortion compensation;

wherein said signal processing section delays the input signal to said compensated electronic device according to the amount of delay equivalent to the detected time difference.

3. A nonlinear compensator for compensating for the nonlinear characteristic of a compensated electronic device that deals with a transfer signal, said nonlinear compensator comprising:

a signal processing section which takes in an input signal and an output signal of said compensated electronic device, demodulates the signals suitably in such a manner that they have the same signal form, detects the time difference and phase difference between the two signals by correlating the two signals with each other, and not only synchronizes the two signals with each other but also causes the phase of one signal to coincide with that of the other on the basis of the detected time difference and phase difference;

a distortion detecting section for detecting, as distortion components, an amplitude error and phase error in the input signal and output signal of said compensated electronic device that have been synchronized with each other and made in phase with one another by the signal processing section; and a distortion correcting section for producing the amount of nonlinear distortion compensation for said compensated electronic device on the basis of the distortion components detected by the distortion detecting section and compensating for the input signal to said compensated electronic device on the basis of the amount of distortion compensation;

wherein said signal processing section gives the amount of phase shift equivalent to the detected phase difference to the input signal or output signal of said compensated electronic device.

4. A nonlinear compensator for compensating for the nonlinear characteristic of a compensated electronic device that deals with a transfer signal, said nonlinear compensator comprising:

a signal processing section which takes in an input signal and an output signal of said compensated electronic device, demodulates the signals suitably in such a manner that they have the same signal form, detects the time difference and phase difference between the two signals by correlating the two signals with each other, and not only synchronizes the two signals with each other but also causes the phase of one signal to coincide with that of the other on the basis of the detected time difference and phase difference;

a distortion detecting section for detecting, as distortion components, an amplitude error and phase error in the input signal and output signal of said compensated electronic device that have been synchronized with each other and made in phase with one another by the signal processing section; and a distortion correcting section for producing the amount of nonlinear distortion compensation for said compensated electronic device on the basis of the distortion components detected by the distortion detecting section and compensating for the input signal to said compensated electronic device on the basis of the amount of distortion compensation;

wherein said distortion correcting section includes an amount-of-compensation table for holding said amount of distortion compensation, registers said amount of distortion compensation at the time of initial setting, reads the amount of distortion compensation corresponding to the amplitude of the input signal to said compensated electronic device from the amount-of-compensation table during service, and compensates for the input signal.

5. The nonlinear compensator according to claim 4, wherein the amount-of-compensation table in said distortion correcting section includes a present-use table and a standby table, stores the amount of distortion compensation obtained at said distortion detecting section and, after the storage has been completed, replaces the present-use table with the standby table.

6. A nonlinear compensator for compensating for the nonlinear characteristic of a compensated electronic device that deals with a transfer signal, said nonlinear compensator comprising:

a signal processing section which takes in an input signal and an output signal of said compensated electronic device, demodulates the signals suitably in such a manner that they have the same signal form, detects the time difference and phase difference between the two signals by correlating the two signals with each other, and not only synchronizes the two signals with each other but also causes the phase of one signal to coincide with that of the other on the basis of the detected time difference and phase difference;

a distortion detecting section for detecting, as distortion components, an amplitude error and phase error in the input signal and output signal of said compensated electronic device that have been synchronized with each other and made in phase with one another by the signal processing section;

a distortion correcting section for producing the amount of nonlinear distortion compensation for said compensated electronic device on the basis of the distortion components detected by the distortion detecting section and compensating for the input signal to said compensated electronic device on the basis of the amount of distortion compensation; and monitor means for monitoring said compensated electronic device by monitoring the distortion components obtained at said distortion detecting section.

7. A nonlinear compensator for compensating for the nonlinear characteristic of a compensated electronic device that deals with a transfer signal, said nonlinear compensator comprising:

a signal processing section which takes in an input signal and an output signal of said compensated electronic device, demodulates the signals suitably in such a manner that they have the same signal form, detects the time difference and phase difference between the two signals by correlating the two signals with each other, and not only synchronizes the two signals with each other but also causes the phase of one signal to coincide with that of the other on the basis of the detected time difference and phase difference;

a distortion detecting section for detecting, as distortion components, an amplitude error and phase error in the input signal and output signal of said compensated electronic device that have been synchronized with each other and made in phase with one another by the signal processing section; and a distortion correcting section for producing the amount of nonlinear distortion compensation for said compensated electronic device on the basis of the distortion components detected by the distortion detecting section and compensating for the input signal to said compensated electronic device on the basis of the amount of distortion compensation;

wherein said signal processing section includes carrier synchronizing means for synchronizing the carrier frequency and carrier phase of the input signal to said compensated electronic device with those of the output signal of said compensated electronic device on the basis of the detected phase difference.

* * * * *